United States Patent
McClure

(10) Patent No.: US 6,816,400 B2
(45) Date of Patent: Nov. 9, 2004

(54) CIRCUIT AND METHOD FOR TESTING A FERROELECTRIC MEMORY DEVICE

(75) Inventor: David C. McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/436,801

(22) Filed: May 12, 2003

(65) Prior Publication Data

US 2003/0206462 A1 Nov. 6, 2003

Related U.S. Application Data

(62) Division of application No. 09/751,986, filed on Dec. 29, 2000, now Pat. No. 6,584,007.

(51) Int. Cl.$^7$ ............................................. G11C 11/22
(52) U.S. Cl. ...................................... 365/145; 365/149
(58) Field of Search ................................ 365/145, 149, 365/201

(56) References Cited

U.S. PATENT DOCUMENTS

| | | | | |
|---|---|---|---|---|
| 5,254,482 A | * | 10/1993 | Fisch | 437/8 |
| 5,274,583 A | | 12/1993 | Rapp | 708/823 |
| 5,608,669 A | | 3/1997 | Mi et al. | 365/185.19 |
| 5,652,725 A | | 7/1997 | Suma et al. | 365/200 |
| 5,764,577 A | | 6/1998 | Johnston et al. | 365/200 |
| 5,909,394 A | | 6/1999 | Chou | 365/185.21 |
| 5,991,189 A | | 11/1999 | Miwa | 365/145 |
| 6,031,777 A | | 2/2000 | Chan et al. | 365/210 |
| 6,041,002 A | | 3/2000 | Maejima | 365/201 |
| 6,044,034 A | | 3/2000 | Katakura | 365/230.05 |
| 6,046,926 A | | 4/2000 | Tanaka et al. | 365/145 |
| 6,094,369 A | | 7/2000 | Ozawa et al. | 365/145 |
| 6,339,357 B1 | | 1/2002 | Yamasaki et al. | 327/538 |
| 6,341,090 B1 | | 1/2002 | Hiraki et al. | 365/200 |
| 6,359,819 B1 | | 3/2002 | McClure | 365/201 |
| 6,512,686 B2 | | 1/2003 | Miyamoto | 365/145 |
| 6,590,799 B1 | * | 7/2003 | Rickes et al. | 365/145 |
| 2002/0053943 A1 | | 5/2002 | Yamasaki | |

FOREIGN PATENT DOCUMENTS

JP        61-22492 A     1/1986

OTHER PUBLICATIONS

U.S. patent application Ser. No. 10/066,182, McClure filed Jan. 31, 2002.
Betty Prince, *Semiconductor Memories*, 1983, Wiley, 2$^{nd}$ Edition, pp. 719–721.
European Search Report, EP 01309859, dated Apr. 23, 2004.

* cited by examiner

*Primary Examiner*—M. Tran
(74) *Attorney, Agent, or Firm*—Lisa K. Jorgenson; Andre Szulwalski

(57) ABSTRACT

A test circuit and method are disclosed for testing memory cells of a ferroelectric memory device having an array of ferroelectric memory cells. The test circuitry is coupled to the column lines, for selectively sensing voltage levels appearing on the column lines and providing externally to the ferroelectric memory device an electrical signal representative of the sensed voltage levels. In this way, ferroelectric memory cells exhibiting degraded performance may be identified.

35 Claims, 5 Drawing Sheets

CIRCUIT AND METHOD FOR TESTING A FERROELECTRIC MEMORY DEVICE

This application is a Div. of Ser. No. 09/751,986 Dec. 29, 2000 U.S. Pat. No. 6,584,007.

BACKGROUND OF THE INVENTION

1. Technical Field of the Invention

The present invention relates to testing ferroelectric memory devices, and particularly to a test circuit and method for testing for effects of degradation of ferroelectric memory cells.

2. Description of the Related Art

Ferroelectricity is a phenomenon which can be observed in a relatively small class of dielectrics called ferroelectric materials. In a normal dielectric, upon the application of an electric field, positive and negative charges will be displaced from their original position—a concept which is characterized by the dipole moment or polarization. This polarization or displacement will vanish, however, when the electric field returns back to zero. In a ferroelectric material, on the other hand, there is a spontaneous polarization—a displacement which is inherent to the crystal structure of the material and does not disappear in the absence of the electric field. In addition, the direction of this polarization can be reversed or reoriented by applying an appropriate electric field.

These characteristics result in ferroelectric capacitors, formed from ferroelectric film or material disposed between parallel conduction plates, being capable of storing in a nonvolatile manner a first charge corresponding to a first polarization state in which the direction of polarization is in a first direction, and a second charge corresponding to a second polarization state in which the direction of polarization is in a second direction opposite the first direction. Ferroelectric capacitors are utilized in nonvolatile random access memory devices having a memory cell array architecture that is similar to the memory cell array architecture of dynamic random access memory (DRAM) devices.

In general terms, there are two types of ferroelectric memory cells. Referring to FIG. 1A, a one transistor, one capacitor (1T1C) memory cell utilizes a pass gate transistor T connected between a column line B and a first plate of ferroelectric capacitor C. A second plate of ferroelectric capacitor C is connected to a plate line P. The gate terminal of pass gate transistor T is connected to a word line W. A memory device utilizing a 1T1C memory cell uses a reference memory cell that is accessed at the same time the 1T1C memory cell is accessed so as to provide a charge differential appearing across a pair of column lines coupled to the 1T1C cell and the reference cell. The use of 1T1C ferroelectric memory cells is known in the art.

Referring to FIG. 1B, a two transistor, two capacitor (2T2C) memory cell includes two ferroelectric capacitors C1 and C2. A first pass gate transistor T1 is connected between a first plate of ferroelectric capacitor C1 and a first column line BL of a column line pair. A second pass gate transistor T2 is connected between a first plate of ferroelectric capacitor C2 and a second column line BL' of the column line pair. A second plate of ferroelectric capacitors C1 and C2 is connected to a plate line P. The gate terminal of pass gate transistors T1 and T2 is connected to the word line W. Each capacitor C1 and C2 stores a charge representative of the polarization state thereof, the charge combining with the charge of the other capacitor to result in a charge differential appearing across column lines BL and BL' when the 2T2C memory cell is accessed. The polarity of the charge differential denotes the binary value stored by the 2T2C memory cell. The use of 2T2C ferroelectric memory cells is known in the art.

A problem with ferroelectric memory devices is the existence of a phenomenon known as imprint. Imprint is a characteristic of ferroelectric films that refers to the tendency of a ferroelectric film/capacitor to prefer one polarization state over another polarization state. Imprint is known to occur when a ferroelectric capacitor is maintained in a single polarization state for a prolonged period of time. Imprint adversely effects the ability of a ferroelectric capacitor to switch between the polarization states. Consequently, the existence of imprint may directly impact the performance of a ferroelectric memory device.

The performance of ferroelectric memory cells has been seen to degrade over time due to a number of other phenomena as well. For instance, ferroelectric memory cells may be effected by fatigue, retaining data over time, etc. When holding data over a prolonged period of time, such as under accelerated conditions during burn-in, a ferroelectric memory cell may be seen to degrade over the course of several hours or days. FIG. 2 shows how a ferroelectric memory cell may be degraded, with the polarization characteristic being shown for a normal ferroelectric memory cell in continuous set of lines and the polarization characteristic being shown for a degraded ferroelectric memory cell in dashed lines. At some point, a memory cell exhibiting degraded performance may store a charge in its ferroelectric capacitor that cannot be sensed by a sense amplifier, thereby rendering the memory cell incapable of storing data values.

It is inconvenient to accurately test the capability of a ferroelectric memory cell to hold a voltage level using conventional memory read operations, to determine whether a long term reliability risk exists with the memory cell. This is in part due to the fact that both memory read operations refresh the charge stored in the corresponding memory cells. Based upon the foregoing, there is a need to be able to more easily test the soundness of a ferroelectric memory.

SUMMARY OF THE INVENTION

The present invention overcomes difficulties with prior test circuits and methods and satisfies a significant need for a test circuit and method for testing the ability of a ferroelectric memory cell to retain a data value. In accordance with an embodiment of the present invention, there is disclosed a ferroelectric memory device having test circuitry therein. The ferroelectric memory device includes an array of ferroelectric memory cells organized into rows and columns. The array includes a plurality of row lines and column lines, with each row line being connected to a row of memory cells and each column line being connected to a column of memory cells. The test circuitry is coupled to the column lines such that when the ferroelectric memory device is configured in a test mode, the test circuitry selectively measures the voltage levels appearing on the column lines and provides externally to the ferroelectric memory device an electrical signal representative of the measured voltage levels.

In particular, the test circuitry senses the voltage level appearing on a selected column line and converts the voltage level to a current level. The test circuitry may include at least one current mirror having a first current leg coupled to the column lines and a second leg coupled to a pad, such as a test pad. A common node between the first and second current legs of the current mirror may also be coupled to another pad, such as a second test pad. When a memory cell is connected to a selected column line, a voltage is created on the selected column line corresponding to the voltage retained in the memory cell. By connecting the first current leg of the current mirror to a selected column line, a current passes through the first current leg in proportion to the voltage appearing on the selected column line. In response, a current passes through the second leg of the current mirror that is in proportion to the current flowing in the first current leg. By sensing the current flow in the second current leg, either by collecting the current on a capacitor or directly sensing the current level, the voltage level appearing on the selected column line may be precisely determined. Once the voltage appearing on the selected column line is precisely known, a determination may be made as to whether the memory cell should be replaced with a redundant memory cell, whether the fabrication process is flawed, etc.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 3:
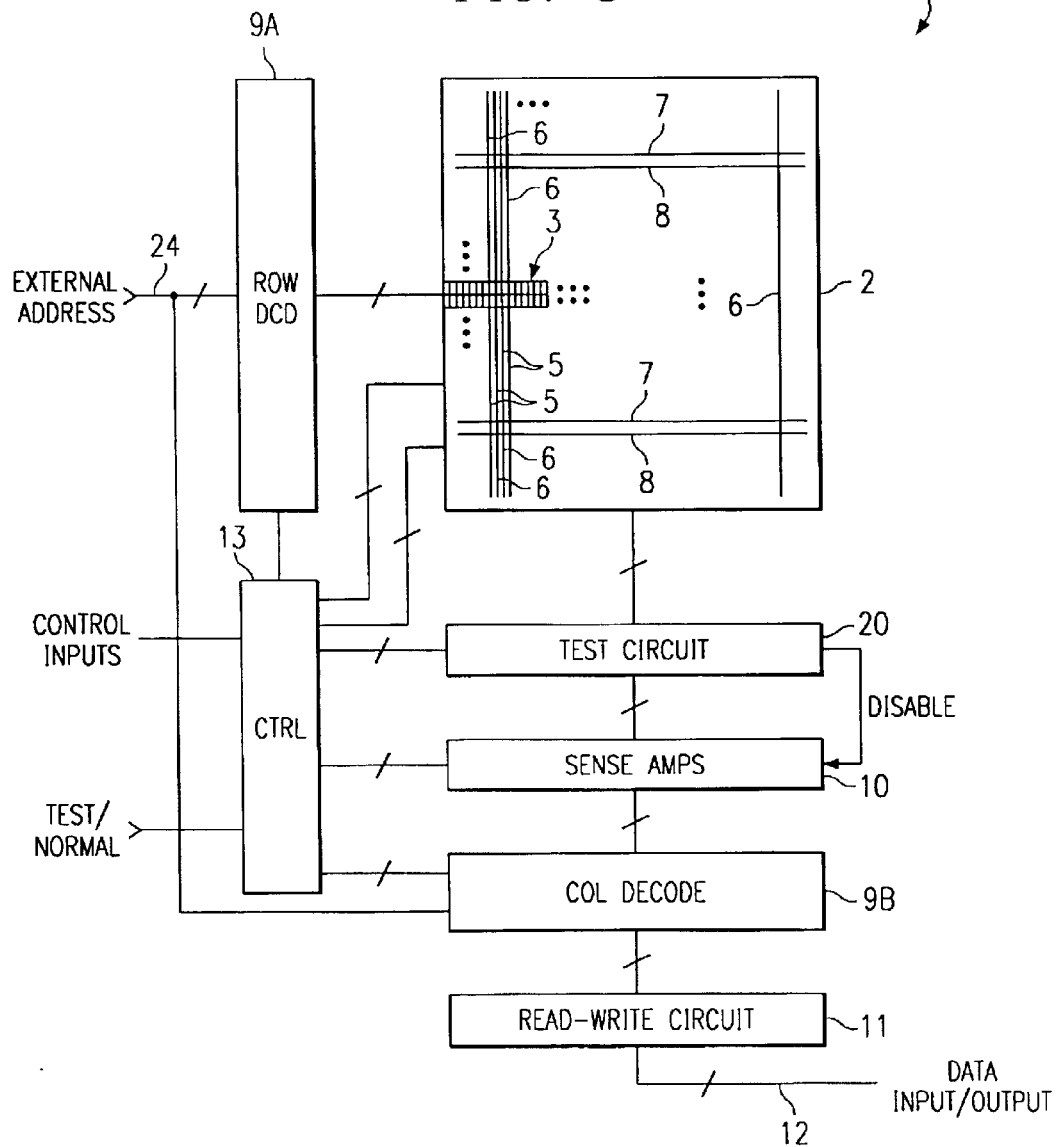
FIG. 3 is a block diagram of a memory device according to an embodiment of the present invention.

Referring to FIG. 3, there is shown a memory device 1 according to a first embodiment of the present invention. Memory device 1 is a nonvolatile memory device, such as a random access ferroelectric memory device. It is understood, however, that memory device 1 may be other memory devices as well. For instance, memory device 1 may include memory cells having elements other than ferroelectric capacitive elements that may provided a degraded performance over time.

In addition, memory device 1 may itself form an integrated circuit or be a memory device that is embedded with other circuitry within an integrated circuit.

Figure 1A:
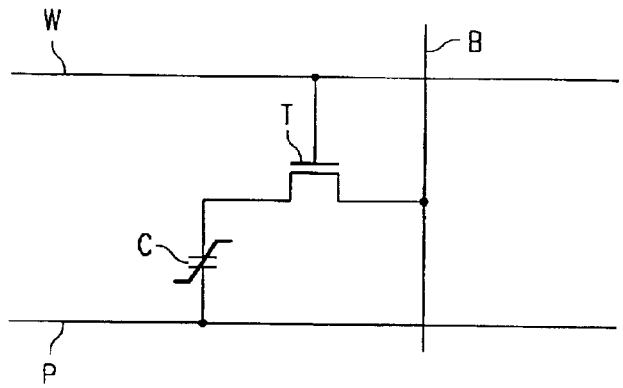
FIGS. 1A and 1B are known circuit schematics of 1T1C and 2T2C memory cells, respectively.
Figure 1B:
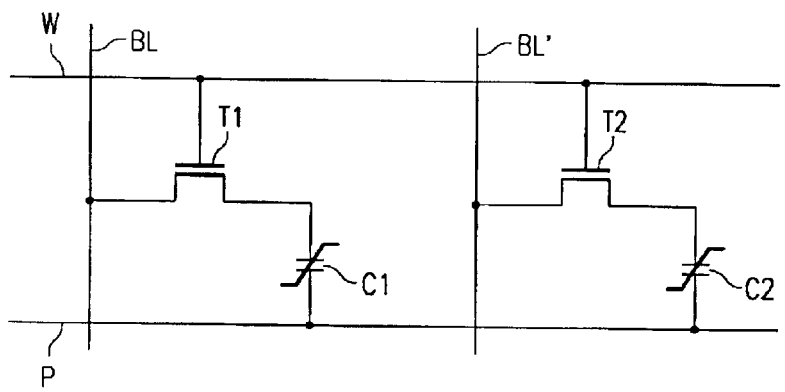

Memory device 1 includes a memory cell array 2 of memory cells 3. Memory cells 3 may be ferroelectric memory cells that include one or more ferroelectric capacitor elements 4. Memory cell 3 may be implemented as a one transistor, one capacitor (1T1C) memory cell (FIG. 1A). Alternatively, memory cell 3 may be implemented as a two transistor, two capacitor (2T2C) memory cell (FIG. 1B).

It is understood that each memory cell 3 may be implemented in other ways using one or more ferroelectric capacitive elements or similar elements.

Memory cell array 2 is arranged into rows and columns of memory cells 3. The memory cells 3 in a row of memory cells 3 are connected to a distinct word line 7 and a distinct plate line 8. The memory cells 3 in a column of memory cells 3 are connected to a distinct column line 6 or pair 5 thereof.

Figure 2:
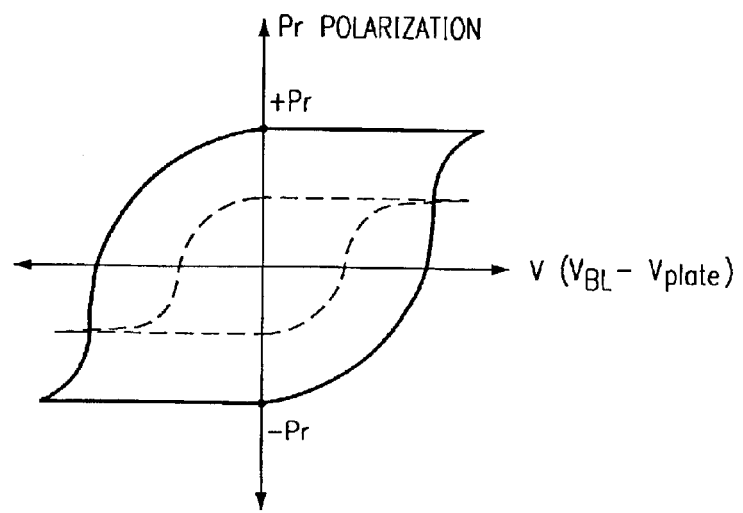
FIG. 2 illustrates the polarization characteristics of a ferroelectric memory cell operating under normal conditions and degraded conditions.

FIG. 2 shows plate lines 8 being parallel to word lines 7. In this configuration, plate lines 8 can be coupled to more than one row of memory cells 3. Alternatively, it is understood that plate lines 8 may be perpendicular to word lines 7. In this configuration, the voltage appearing across the ferroelectric capacitors in the memory cells 3 in rows that are not being accessed will not vary when the plate line 8 connected to such memory cells 3 is asserted. This is due to the fact that the transistor(s) in the unaccessed memory cells 3 are turned off, so the plate connected to the transistor simply follows the voltage change appearing on the capacitor plate connected to the asserted plate line 8. In either the parallel or perpendicular configuration, it is understood that back plate lines 8 may be partitioned into smaller segments so that back plate lines 8 may be more easily driven.

Memory device 1 further includes address logic 9, such as a row decoder circuit 9A, which receives an address value and asserts a word line 7 and plate line 8 pair corresponding to the address value; and column decoder circuit 9B, which receives the address value and connects one or more column lines 6 to data input/output bus 12 via data input/output block 11. Sense amplifiers 10 are controlled to sense a charge differential appearing across a pair of column lines 6 and drive the column lines 6 to the high voltage reference Vdd and low voltage reference Vss based upon the polarity of the charge differential. Input/output (I/O) block 11 serves as an interface between column lines 6 and the external input/output (I/O) data bus 12, wherein pairs of column lines 6 selected by the address value are connected thereto. A control circuit 13 provides necessary timing and control signals to memory cell array 2, address logic 9, sense amplifiers 10 and data input/output block 11 to preform read and write memory access operations.

Memory device 1 is shown in FIG. 3 as having a bidirectional external data bus 12. It is understood that memory device 1 may include separate unidirectional data input and data output buses instead.

As stated above, the performance of ferroelectric memory cells have been found to degrade over time. In an effort to closely measure an extent of performance degradation of ferroelectric memory cells for purposes of memory cell replacement or fabrication process analysis, memory device 1 includes a test circuit 20.

Test circuit 20 is adapted to sense the voltage level appearing across the capacitor element of the ferroelectric memory cells 3 and provide externally to memory device 1 an electrical signal representative of the sensed voltage level. Test circuit 20 is capable of operating during the testing and/or characterizing of memory device 1, such as during wafer sort. It is understood, however, that test circuit 20 may be used to analyze memory device 1 at times other than at wafer sort.

During a memory access operation, such as a memory read operation, the charge stored across the capacitive element C in a ferroelectric memory cell 3 is shared with the charge initially appearing on the corresponding column line 6. Test circuit 20 converts into a current the voltage appearing on the column line 6 after a selected ferroelectric memory cell 3 is connected thereto. The converted current, having a current level that is proportional to the voltage level appearing on the column line 6, may be then sensed or integrated on a charge storage device.

Figure 4:
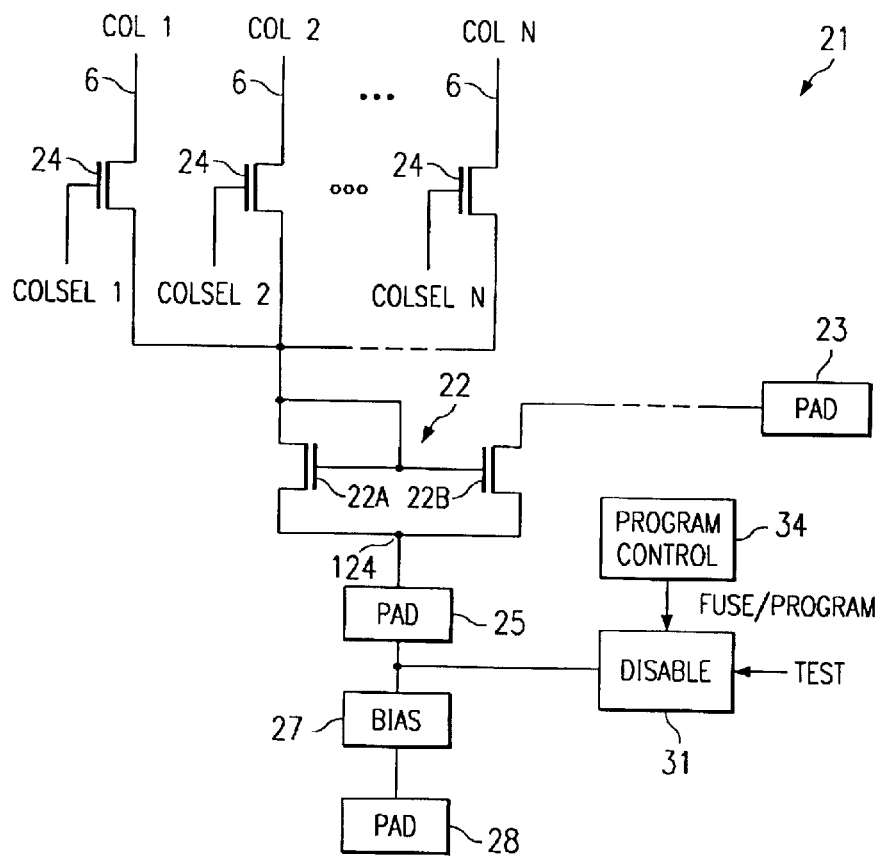
FIG. 4 is a test circuit for the memory device of FIG. 3.

In a first embodiment of the present invention, test circuit 20 includes current mirror circuitry 21. As shown in FIG. 4, current mirror circuitry 21 includes a current mirror circuit 22 having a first current leg 22a selectively coupled to column lines 6 and a second current leg 22B connected to the first current 22A and coupled to a pad 23 when memory device 1 is configured into a test mode. Pad 23 is a pad appearing on the integrated circuit in which memory device 1 is formed that is capable of being connected to a tester probe (for wafer level testing) or a package pin (for post-packaging testing). Test circuit 20 further includes a transmission or pass gate 24 connected between first current leg 22A and a distinct column line 6. When memory device 1 is configured into the test mode, column address decode logic 9B activates one of the transmission gates 24 based upon the address value received by memory device 1. In this way, a single column line 6 and hence a single memory cell 3 may be tested at a time.

Current mirror 22 is shown in FIG. 4 as being implemented by MOS transistors. It is understood that current mirror 22 may be implemented with other transistor types as well. It is further understood that the relative sizes of the transistors in current mirror 22 may be set so that the current level flowing through the second leg 22B is substantially greater than the current level flowing through first current leg 22A of current mirror 22.

First current leg 22A generates a current having a current level that is based upon the voltage level appearing on the selected column line 6. A proportional current level is then caused to flow through second leg 22B of current mirror 22, which is sensed at the output pad 23 by suitable test equipment. By measuring the sensed current level flowing through second current leg 22B, a determination can be made to determine the charge and/or voltage level stored by the memory cell 3 connected to the selected column line 6. This determination may be then used to determine whether the performance of memory cell 3 has degraded.

A common node 124 between first current leg 22A and second current leg 22B is coupled to a second pad 25 when memory device 1 is configured in the test mode. This allows for common node 124 to be set to a voltage during the test mode so that the transistor in first current leg 22A is biased at the point of conduction. In other words, common node 124 is set to a threshold voltage below the node between first current leg 22A and the transmission gates 24 so that current mirror 22 may detect the entire charge on the selected column line 6. In the exemplary disclosed embodiments of memory device 1, column lines 6 are precharged to the ground potential. As a result, common node 124 may be set to a threshold voltage below ground during the test.

Figure 5:
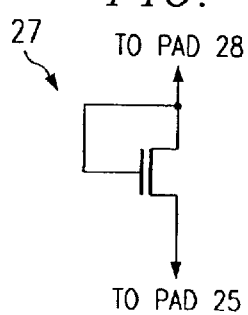
FIG. 5 is an implementation of a biasing circuit for the test circuit of FIG. 4.

Test circuitry 20 may include a bias circuit 27 for accurately biasing common node 124 during the test mode. FIG. 5 shows an embodiment of bias circuit 27 as having a single transistor that is configured as the transistor in first current mirror 22A is connected, i.e., having a source terminal coupled to pad 25 and a gate and drain terminal connected together to a pad 28. The transistor of bias circuit 27 has the same fabrication characteristics as that of the transistor of current leg 22A. In this way, pad 28 may be set to the precharge voltage of column lines 6 and the voltage on pad 25 varied until the current sensed thereon indicates that transistor of bias circuit 27 (and hence the transistor of first current leg 22A) is biased at the point of conduction.

Figure 6:
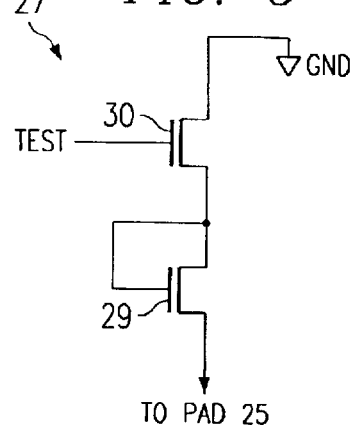
FIG. 6 is another implementation of the biasing circuit for the test circuit of FIG. 4.

FIG. 6 is another implementation of bias circuit 27 for use in memory devices 1. This bias circuit includes a first transistor 29 that is connected as the transistor of first current leg 22A is connected, and an enabling transistor 30 that is connected between transistor 29 and the ground potential. A control signal TEST is asserted during the test mode so that the drain terminal of transistor 29 is coupled to the ground potential. In this way, when memory device 1 is in the test mode, pad 25 may be set to the appropriate voltage level so that transistor 29 is biased at the point of conduction, thereby ensuring that the transistor of first current leg 22A is similarly biased at the point of conduction.

Instead of controlling the voltage on common node 124 relative to the precharge voltage on column lines 6, it is understood that common node 124 may be tied to a fixed voltage level, such as ground, and the precharge voltage applied to column lines 6 adjusted so that the transistor in first current leg 22A is biased to the point of conduction. In this alternative embodiment, the precharge circuitry may be controlled/configured/selectively connected to a pad so as to allow for the external setting of the column lines 6 to the desired voltage level.

Figure 7:
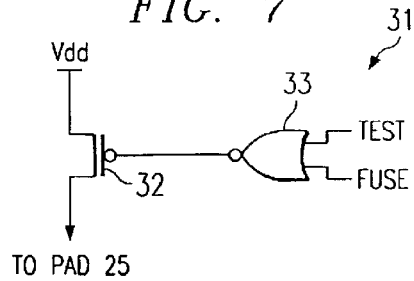
FIG. 7 is an implementation of a disabling circuit for the test circuit of FIG. 4.

Test circuit 20 may include a disabling circuit 31 for disabling current mirror circuitry 21 when memory device 1 is configured in a normal mode of operation. As shown in FIG. 7, disabling circuit 31 disables current mirror circuitry 21 by selectively pulling pad 25, to which common node 124 is coupled, to the high reference voltage, Vdd. Disabling circuit 31 may include a transistor 32 having a drain terminal coupled to pad 25 and a source terminal connected to the high reference voltage, Vdd. A gate 33, such as a logic NOR gate, drives the gate terminal of transistor 32. The inputs to gate 33 may be test control signal TEST and a signal generated from programmed circuit 34. Program circuit 34 may be utilized following the testing of memory cells 3 so that current mirror circuitry 21 is thereafter disabled. Program circuit 34 may be, for example, a fuse circuit that is programmed to assert the output signal from program circuit 34. It is understood, however, that fuse circuit 34 may include programmable elements other than fuses.

Figure 8:
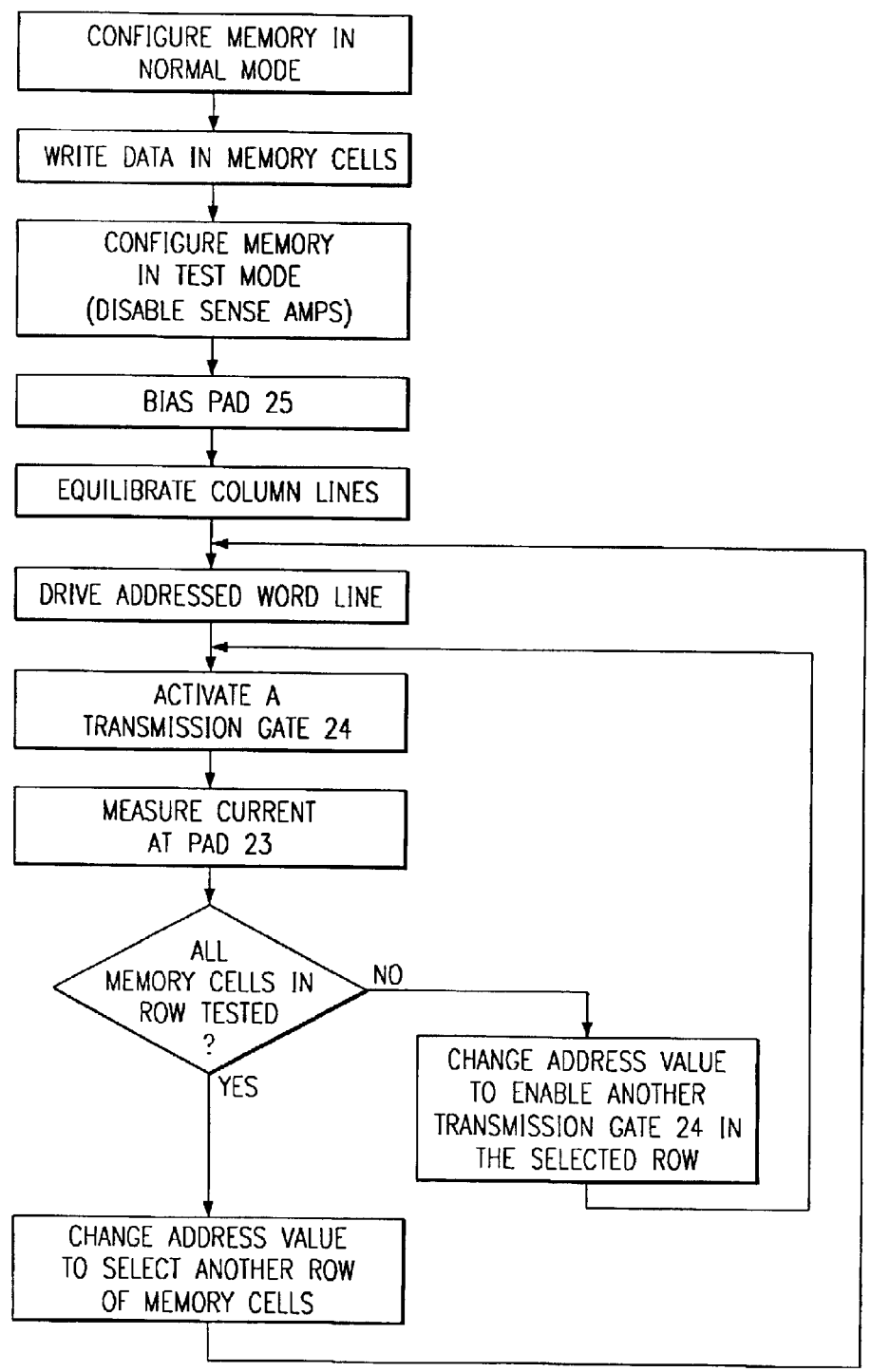
FIG. 8 is a flow chart illustrating an operation of the memory device of FIG. 3.

The operation of ferroelectric memory device 1 will be described with reference to FIG. 8. Initially, memory device 1 is configured into a normal mode of operation. Next, a plurality of write operations are executed so that each memory cell 3 stores a data value. Memory device 1 is then configured in the test mode. This may be performed by setting one or more input test signals. Pad 25 is then biased to a voltage level so that the transistor of first current leg 22A is at the point of conduction, based upon the drain terminal of the transistor of first current leg 22A being precharged to the ground potential.

When in the test mode, sense amplifiers 10 are disabled or otherwise disconnected to column lines 6 so as to be incapable of sensing voltage levels appearing thereon. This results in a memory read operation that is modified for the test mode. In response to the received address value, row address decode circuit 9A drives a word line 7 to a voltage level so as to connect to column lines 6 to capacitive elements C of memory cells 3 in the selected row. This causes the charge appearing in each memory cell 3 in the selected row to be shared with the charge (zero charge) appearing on the corresponding column line 6, thereby changing the voltage appearing on the corresponding column line 6 accordingly. Column address decode circuit 9B activates at least one transmission gate 24 based upon the received address value, so that the selected column line(s) 6 is connected to current mirror 22. The voltage appearing on the selected column line 6 causes a current level to flow through first current leg 22A, which thereupon causes a proportional current level to flow in the second leg 22B. By sensing the current flowing through second current leg 22A, the voltage level stored in memory cell 3 connected to the selected column line 6 may be determined. Changing the address value applied to memory device 1 is thereafter altered to select another column line 6 in the selected row to current mirror 22. When all the memory cells 3 in the selected row have been tested, the address value is changed to select another row of memory cells 3. When all the memory cells 3 have been tested, current mirror circuit 22 is disabled by pulling pad 25 to Vdd. This is accomplished by driving the gate terminal of transistor 32 to Vdd.

Figure 9:
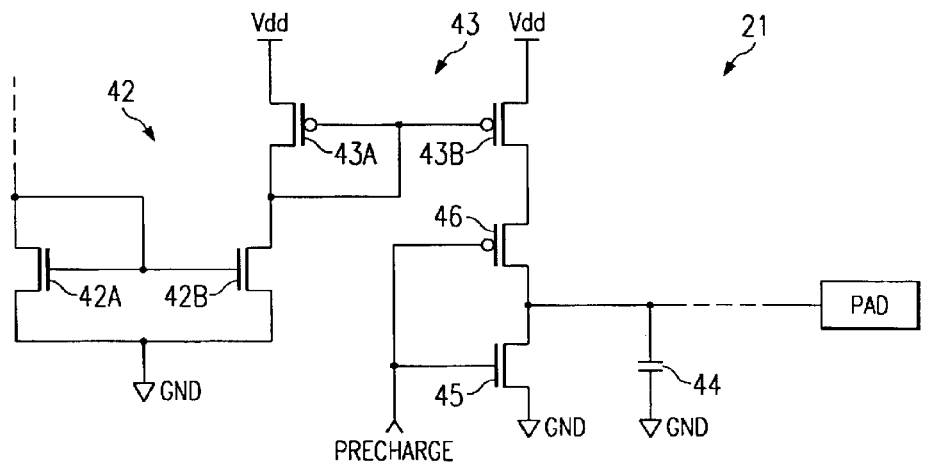
FIG. 9 is a second embodiment of the test circuit for the memory device of FIG. 3.

In another embodiment of the present invention shown in FIG. 9, current mirror circuitry 21 includes a first current mirror 42 having a first current leg 42A selectively coupled to one or more column lines 6, and a second current leg 42B connected to the first current leg 42A. Current mirror circuitry 21 further includes a second current mirror 43 having a first current leg 43A connected to the second current leg 42B of current mirror 42, and a second current leg 43B coupled to the first current leg 43A. As can be seen, the voltage level appearing on a selected column line 6 results in a current passing through first current leg 42A, which thereupon causes a proportional current level to flow through the second current leg 42B of current mirror 42. The current flowing through the second current leg 42A of current mirror 42 thereby flows through the first current leg 43A of current mirror 43, which thereupon causes a proportional current level to flow through the second current leg 43A of current mirror 43.

As shown in FIG. 9, current mirrors 42 and 43 are implemented with MOS transistors. It is understood that current mirrors 42 and 43 may be implemented with other transistor types as well. It is further understood that the relative sizes of the transistors in current mirrors 42 and 43 may be set so that the current flowing through the second current leg 43B of current mirror 43 is substantially greater than the current flowing through the first current leg 42A of current mirror 42.

Current mirror circuitry 21 further includes a capacitor 44 having a first plate coupled to the second current leg 43B of current mirror 43 and a second plate coupled to a reference voltage level, such as ground. Capacitor 44 is suited to integrate the current flowing through second current leg 43B and otherwise collect a charge that is proportional to the current of the second current leg 43B. By coupling capacitor 44 to an external pad, such as a test pad, the voltage across capacitor 44, which is proportional to the currents passing through current mirrors 42 and 43 and therefore proportional to the voltage appearing on selected column line 6, may be quickly and easily measured.

Current mirror circuitry 21 of FIG. 9 further includes a circuit for precharging capacitor 44 prior to being charged by current mirror 43. As shown in FIG. 4, the circuit for precharging may include a precharge transistor 45 connected between capacitor 44 and ground. When activated, precharge transistor 45 discharges the capacitor 44. Current mirror circuitry 21 may further include access transistor 46 connected between capacitor 44 and the second current leg 43A of current mirror 43. When activated, access transistor 46 connects capacitor 44 to current mirror 43. In this disclosed embodiment, the gate or control terminal of precharge transistor 45 and access transistor 46 may be driven by a control signal PRECHARGE, so that when control signal PRECHARGE is asserted, capacitor 44 is disconnected from current mirror 43 and discharged. When control signal PRECHARGE is de-asserted, capacitor 44 is no longer discharged and is instead connected to current mirror 43. In this way, capacitor 44 may be initially precharged (or discharged, in this case) prior to collecting charge from current mirror 43.

The operation of current mirror circuitry 21 of FIG. 9 is as follows. Initially, signal PRECHARGE is asserted so as to discharge capacitor 44. Signal PRECHARGE may, for example, be asserted during the time the column lines 6 of memory cell array 2 is equilibrated and precharged. After equilibration, an address value may be decoded by address logic 9 and a word line 7 asserted as a result. The assertion of a selected word line 7 connects a row of memory cells 3 to the column lines 6 and thereby creates a charge on each column line 6 representative of the charge stored in the memory cell 3 connected thereto. Next, signal PRECHARGE is de-asserted, thereby connecting capacitor 44 to the current mirror 43. With a selected column line 6 being connected to the first current leg 42A of current mirror 42, a current flows through first current leg 42A in proportion to the voltage on column line 6, which causes a proportional current to flow through second current leg 42B as well as through first current leg 43A. A current flows through the second current leg 43B of current mirror that is proportional to the current in first current leg 43A, which causes capacitor 44 to collect charges and develop a voltage across capacitor 44. Following the charging of capacitor 44, a pad, such as a test pad, may sense the voltage across capacitor 44. Because the voltage across capacitor 44 is proportional to the voltage that appeared on the selected column line 6, an accurate indication of the ability of the memory cell 3 connected to the selected column line 6 to charge column line 6 is determined.

Figure 10:
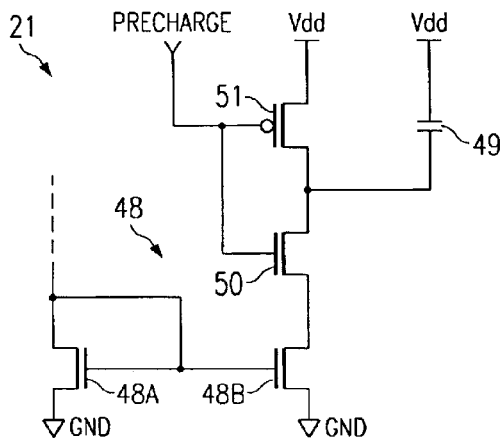
FIG. 10 is a third embodiment of the test circuit for the memory device of FIG. 3.

FIG. 10 is another implementation of current mirror circuitry 21 according to a second embodiment of the present invention. In this case, current mirror circuitry 21 includes a single current mirror 48 having a first current leg 48A and a second current leg 48B. A capacitor 49 is connected to the second current leg 48B via access transistor 50. A precharge transistor 51 is connected in parallel with the transistor of second current leg 48B. Control signal PRECHARGE drives the gate terminals of access transistor 50 and precharge transistor 51 so as to precharge capacitor 49 prior to capacitor 49 being connected to current mirror 48. In operation, connection of a selected column line 6 induces a current in the first current leg 48A and a proportional current through the second current leg 48B of current mirror 48, thereby creating a voltage differential across capacitor 49. When the charging is complete, a test pad or other pad may be connected across capacitor 49 so as to sense the voltage thereacross. Because the voltage across capacitor 49 is proportional to the currents through current mirror 48 and hence the voltage appearing on the selected column line 6, a determination of the ability of the memory cell 3 connected thereto may be ascertained.

Figure 11:
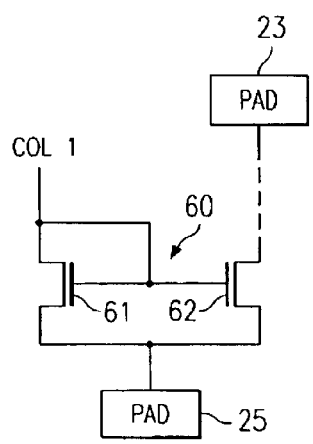
FIG. 11 is another embodiment of the test circuit for the memory device of FIG. 3.

Still another embodiment of the present invention is shown in FIG. 11. In this case, a current mirror 60 is connected to a single column line 6, with each column line 6 being connected to a distinct current mirror 60. Current mirror 60 includes a first current leg 61 connected to a column line 60, and a second current leg 62 connected to pad 23. By connecting the common node of current mirror 60 to another pad, such as pad 25, the transistor in first current leg 61 may be initially biased to the point of conduction, as discussed above with respect to test circuit 20 of FIG. 4.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit, comprising:
   a ferroelectric memory device, comprising:
   a ferroelectric memory cell; and
   a current mirror, coupled to the ferroelectric memory cell, including a first current leg for measuring an extent of polarization of the ferroelectric memory cell and a second current leg for providing the measurement externally of the integrated circuit.

2. The integrated circuit of claim 1, wherein:
   the current mirror measures a voltage level maintained in the ferroelectric memory cell and provides externally of the integrated circuit an electrical signal representative of the measured voltage level.

3. The integrated circuit of claim 1, wherein the ferroelectric memory device comprises a plurality of ferroelectric memory cells, further comprising means for selecting one of the memory cells, the current mirror measuring an extent of polarization of the selected ferroelectric memory cell and providing the measurement externally of the integrated circuit.

4. The integrated circuit of claim 3, wherein the second current leg is coupled to a pad on the integrated circuit, and wherein the means for selecting includes a plurality of transmission gates, each transmission gate coupling the first current leg to a distinct group of ferroelectric memory cells.

5. An integrated circuit, comprising:
   a ferroelectric memory device, comprising:
   a ferroelectric memory cell comprising a ferroelectric capacitor; and
   test circuitry, coupled to the ferroelectric memory cell, for selectively measuring an extent of polarization of the ferroelectric memory cell by measuring a voltage level maintained in the ferroelectric memory cell and providing an electrical signal representative of the measurement externally of the integrated circuit, the test circuitry converting a voltage level appearing across the ferroelectric capacitor to a current level and providing the current level externally of the integrated circuit.

6. An integrated circuit, comprising:
   a ferroelectric memory device, comprising:
   a ferroelectric memory cell;
   test circuitry, coupled to the ferroelectric memory cell, for selectively measuring an extent of polarization of the ferroelectric memory cell by measuring a voltage level maintained in the ferroelectric memory cell and providing an electrical signal representative of the measurement externally of the integrated circuit, the test circuitry comprising a current mirror having a first current leg coupled to the ferroelectric memory cell and a second current leg coupled to a pad on the integrated circuit.

7. The integrated circuit of claim 6, wherein the test circuitry further comprises a plurality of transmission gates connected between the column lines and the first leg of the current mirror.

8. The integrated circuit of claim 6, wherein the test circuitry further comprises a circuit for biasing a common node between the first and second current legs of the current mirror.

9. A method of testing a ferroelectric memory device having an array of ferroelectric memory cells, comprising:
   sensing a voltage level corresponding to a voltage level appearing in the at least one ferroelectric memory cell to measure an extent of polarization of that cell;
   converting the sensed voltage level into a current level that is proportional to the sensed voltage level; and
   providing the current level as an electrical signal externally of the ferroelectric memory device.

10. The method of claim 9, further comprising collecting the current level on a capacitor.

11. The method of claim 9, wherein: the array of ferroelectric memory cells is arranged into a plurality of rows and columns and includes a plurality of column lines coupled to the columns of ferroelectric memory cells; and the step of sensing comprises sensing voltage levels appearing on the column lines.

12. The method of claim 11, further comprising selecting a column line corresponding to the at least one ferroelectric memory cell prior to the step of sensing.

13. An apparatus, comprising:
   a ferroelectric memory device, comprising:
   a plurality of ferroelectric memory cells; and
   a current mirror, selectively coupled to individual ones of the ferroelectric memory cells, including a first current leg for measuring an extent of polarization of the selected one of the ferroelectric memory cells and a second current leg for providing the measurement externally of the apparatus.

14. The apparatus of claim 13, wherein the second current leg is coupled to an output pad.

15. The apparatus of claim 13, wherein the second current leg is coupled to an output of the apparatus.

16. The apparatus of claim 13, wherein a common node between the first and second current legs of the first current mirror is coupled externally of the ferroelectric memory device.

17. The apparatus of claim 13, wherein the second current leg of the first current mirror is coupled externally of the ferroelectric memory device.

18. The apparatus of claim 13, wherein the current mirror further comprises a capacitor coupled to the second current leg of the current mirror and precharge circuitry coupled to the capacitor.

19. The apparatus of claim 18, wherein the precharge circuitry comprises a first transistor coupled between the capacitor and a reference voltage source.

20. The apparatus of claim 13, wherein:
   each of the first and second legs of the first current mirror comprises a transistor connected to a common node; and
   the ferroelectric memory device further comprises a bias circuit, coupled to the common node, for selectively maintaining the common node at a predetermined voltage level.

21. The apparatus of claim 20, wherein:
the bias circuit comprises a test transistor having a first conduction terminal coupled to the common node and a second conduction terminal coupled externally of the ferroelectric memory device, the test transistor having similar operating characteristics to the operating characteristics of the transistor of the first leg of the first current mirror.

22. The apparatus of claim 20, wherein:
the bias circuit comprises a first test transistor having a first conduction terminal coupled to the common node and a second conduction terminal, and a second transistor having a first conduction terminal connected to the second conduction terminal of the first test transistor and a second conduction terminal coupled to a reference voltage line, the first test transistor having similar operating characteristics to the operating characteristics of the transistor of the first leg of the first current mirror.

23. The apparatus of claim 13, wherein:
the first and second current legs of the current mirror are coupled to a common node; and
the test circuitry further comprises a transistor coupled to the common node and having a control terminal coupled to a test control signal.

24. The apparatus of claim 13, wherein the current mirror converts sensed voltage levels corresponding to voltages maintained in the selected one of the ferroelectric memory cells to voltage levels and provides the voltage levels externally of the ferroelectric memory device.

25. An apparatus, comprising:
a ferroelectric memory device, including row lines and column lines comprising;
a plurality of ferroelectric memory cells arranged in rows and columns, each row of ferroelectric memory cells being coupled to a row line and each column of memory cells being coupled to a column line; and
test circuitry, coupled to the ferroelectric memory cells, for selectively measuring an extent of polarization of the ferroelectric memory cells and providing the measurement externally of the apparatus, the test circuitry comprising a first current mirror, coupled to the column lines, including a first current leg coupled to the column lines and a second current leg.

26. The apparatus of claim 25, wherein the test circuitry further comprises a transmission gate connected between the first current leg of the first current mirror and the column lines coupled thereto.

27. The apparatus of claim 25, wherein the test circuitry further comprises a plurality of transmission gates, each transmission gate being connected between the first current leg of the first current mirror and a distinct column line.

28. The apparatus of claim 25, wherein the test circuitry further comprises:
a second current mirror having a first current leg coupled to the second current leg of the first current mirror, and a second current leg.

29. The apparatus of claim 28, wherein the test circuitry further comprises:
a capacitor coupled to the second current leg of the second current mirror, to collect a charge that is proportional to a current level flowing through the second current leg of the second current mirror.

30. An apparatus, comprising:
a ferroelectric memory device, comprising:
a plurality of ferroelectric memory cells;
sense amplifier circuitry coupled to the ferroelectric memory cells; and
test circuitry, coupled to the ferroelectric memory cells, for selectively measuring an extent of polarization of the ferroelectric memory cells and providing the measurement externally of the apparatus, the test circuitry disabling the sense amplifier circuitry during a test operation.

31. An apparatus, comprising:
a ferroelectric memory device, comprising:
a plurality of ferroelectric memory cells; and
test circuitry, coupled to the ferroelectric memory cells, for selectively measuring an extent of polarization of the ferroelectric memory cells and providing the measurement externally of the apparatus, wherein the test circuitry converts sensed voltage levels corresponding to voltages maintained in the ferroelectric memory cells to current levels and provides the current levels externally of the ferroelectric memory device.

32. A method of testing a ferroelectric memory cell, comprising:
sensing a voltage level corresponding to a voltage level appearing in the ferroelectric memory cell to measure an extent of polarization of that cell;
converting the sensed voltage level into a current level that is proportional to the sensed voltage level; and
providing the current level as an electrical signal externally of the ferroelectric memory device.

33. The method of claim 32, wherein the ferroelectric memory cell is one of a plurality of memory cells arranged in an array of ferroelectric memory cells having a plurality of rows and columns which include a plurality of column lines; and
the step of sensing comprises sensing voltage levels appearing on the column lines.

34. The method of claim 33, further comprising selecting the column line corresponding to the ferroelectric memory cell prior to the step of sensing.

35. The method of claim 32, further comprising collecting the current level on a capacitor.

* * * * *